US 8,890,147 B2

(12) United States Patent
Cheng

(10) Patent No.: US 8,890,147 B2
(45) Date of Patent: Nov. 18, 2014

(54) PIXEL, A STORAGE CAPACITOR, AND A METHOD FOR FORMING THE SAME

(75) Inventor: Yi-Sheng Cheng, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 1749 days.

(21) Appl. No.: 12/048,631

(22) Filed: Mar. 14, 2008

(65) Prior Publication Data

US 2008/0251790 A1    Oct. 16, 2008

(30) Foreign Application Priority Data

Apr. 13, 2007    (TW) .............................. 96113102 A

(51) Int. Cl.
  *H01L 27/32*    (2006.01)
  *H01L 27/13*    (2006.01)
  *G02F 1/1362*   (2006.01)
  *H01L 27/12*    (2006.01)

(52) U.S. Cl.
  CPC .......... *H01L 27/13* (2013.01); *G02F 1/136213* (2013.01); *H01L 27/1214* (2013.01)
  USPC ........................................................ 257/59

(58) Field of Classification Search
  CPC .............. H01L 29/458; H01L 29/4908; H01L 29/42384; H01L 27/32
  USPC ........................................................ 257/59
  See application file for complete search history.

(56) References Cited

U.S. PATENT DOCUMENTS

| 6,281,535 | B1 | 8/2001 | Ma et al. | |
|---|---|---|---|---|
| 6,493,046 | B1 | 12/2002 | Ueda | |
| 7,071,036 | B2 | 7/2006 | Yang | |
| 7,196,746 | B2 | 3/2007 | Yang | |
| 2005/0161677 | A1* | 7/2005 | Jung et al. | ........................ 257/72 |
| 2005/0190312 | A1* | 9/2005 | Yang | .............................. 349/38 |
| 2005/0202601 | A1 | 9/2005 | Koide | |
| 2006/0240577 | A1 | 10/2006 | Ashikaga | |
| 2007/0291193 | A1 | 12/2007 | Cheng | |

FOREIGN PATENT DOCUMENTS

| CN | 1877432 | 12/2006 |
|---|---|---|
| JP | 2006303188 | 11/2006 |

OTHER PUBLICATIONS

English language translation of abstract and pertinent parts of JP 2006303188.
English language translation of abstract and pertinent parts of CN 1877432.

* cited by examiner

*Primary Examiner* — Thao X Le
*Assistant Examiner* — Geoffrey Ida
(74) *Attorney, Agent, or Firm* — McClure, Qualey & Rodack, LLP

(57) ABSTRACT

A pixel, a storage capacitor, and a method for forming the same. The storage capacitor formed on a substrate comprises a semiconductor layer, a first dielectric layer, a first conductive layer, a second dielectric layer and a second conductive layer. The semiconductor layer is formed on the substrate wherein the semiconductor layer and the substrate are covered by the first dielectric layer. The first conductive layer is formed on a part of the first dielectric layer. The second dielectric layer is formed on the first conductive layer, and the lateral side of the stacking structure including the second dielectric layer and the first conductive layer has a taper shaped. The second conductive layer is formed on a part of the second dielectric layer.

15 Claims, 15 Drawing Sheets

PIXEL, A STORAGE CAPACITOR, AND A METHOD FOR FORMING THE SAME

RELATED APPLICATIONS

This application claims priority to Taiwan Application Number 96113102, filed Apr. 13, 2007, the contents of which are herein incorporated by reference in its entirety.

BACKGROUND

1. Field of Invention

The present invention relates to a flat panel display and, more particularly, to a capacitor of a flat panel display.

2. Description of Related Art

The flat panel display consists of several pixels. Each pixel comprises a pixel electrode and a thin-film transistor (TFT) connected to the pixel electrode. A signal line transmits signals to the TFT to turn on/off the TFT. After the pixel electrode provides the voltage, the TFT is turned off until a scan line turns on the TFT at the next time, so that the voltage can be rewritten into the pixel electrode or removed from the pixel electrode.

However, to maintain the previous voltage written in the pixel electrode prior to second time the scan line turns on the TFT, the storage capacitor ($C_{st}$) is needed to enlarge the whole capacity so that the voltage written in the pixel electrode can last longer. The power stored by the storage capacitor is directly proportional to the areas of both the anode and the cathode of the storage capacitor, and is inversely proportional to the distance between the anode and the cathode.

However, continuous improvement in the resolution of the screen results in a corresponding reduction in the pixel size. In order not to affect the aperture ratio, the area of the storage capacitor needs to be compressed which lowers the capacity. In addition, the storage capacitor manufactured by the conventional process, the thickness of the dielectric layer must be greater than 3000 Å and this will limit the storage ability of the storage capacitor to store power. Therefore, it is an important issue to enhance the capacity of the storage capacitor so that the image stabilization of a pixel could be maintained.

SUMMARY

The present invention is directed to a storage capacitor and a method of manufacturing thereof to enhance the capacity of the storage capacitor.

It is therefore an objective of the present invention to provide a storage capacitor, disposed on a substrate, comprising at least one semiconductor layer disposed on the substrate; at least one first dielectric layer covering the semiconductor layer and the substrate; at least one conductive layer disposed on a part of the first dielectric layer; at least one second dielectric layer disposed on the first conductive layer, wherein the second dielectric layer and the first conductive layer is formed a stacking structure and a lateral side of the stacking structure has a substantially tapered shaped; and at least one second conductive layer disposed on a part of the second dielectric layer The storage capacitor provided by the present invention is adapted to a pixel. The pixel is formed on a substrate and has at least one switch element area and at least one capacitor area, which comprises at least one semiconductor layer formed on the substrate of the switch element area and the capacitor area; at least one first dielectric layer covering the semiconductor layer and the substrate; at least one first conductive layer formed on a part of the first dielectric layer of the switch element area and the capacitor area; at least one second dielectric layer formed on the first conductive layer of the switch element area and the capacitor area; at least one etching-stop layer, a part of the etching-stop layer formed on the second dielectric layer of the switch element area; at least one interlayer dielectric layer covering on the substrate; at least one source/drain formed on a part of the interlayer dielectric layer of the switch element area and electrically connected to the semiconductor layer of the switch element area; at least one passivation layer covering the substrate; and at least one second conductive layer disposed on a part of the passivation layer and electrically connected to one of the source/drain and disposed on a part of the second dielectric layer through at least one opening within the passivation layer and the interlayer dielectric layer.

The pixel provided by the present invention is adapted to a display panel. The display panel comprises the above-mentioned pixel and a signal line.

The display panel provided by the present invention is adapted to a display. One embodiment, the display comprises a backlight source and the above-mentioned display panel. The backlight source can be the main light source of the display.

The display provided by the present invention is adapted to an electro-optical apparatus. The electro-optical apparatus comprises an electrical element and the above-mentioned display.

It is also an objective of the present invention to provide a method of manufacturing a pixel disposed on a substrate and including at least one switch element area and at least one capacitor area. The method comprises forming at least one semiconductor layer on a substrate of the switch element and the capacitor area; forming at least one first dielectric layer to cover the semiconductor layer and the substrate; forming at least one first conductive layer, at least one second dielectric layer, and at least one etching-stop layer in sequence on the first dielectric layer; patterning the first conductive layer, the second dielectric layer, and the etching-stop layer to form a gate stack structure on the switch element area and a capacitor stack structure on the capacitor area; forming at least one interlayer dielectric layer to cover the gate stack structure, the capacitor stack structure, and the first dielectric layer; forming at least one source/drain on a part of the interlayer dielectric layer of the switch element area, so that the source/drain is electrically connected to the semiconductor layer of the switch element area; forming at least one passivation layer to cover the source/drain and the interlayer dielectric layer; patterning the passivation layer and the interlayer dielectric layer to form a contact window and an opening in the passivation layer, so that the opening exposes the etching-stop layer; selectively etching the etching-stop layer till a part of the second dielectric layer is exposed; and forming at least one second conductive layer on a part of the passivation layer, so that the second conductive layer is electrically connected to one of the source/drain through the contact window and is disposed on a part of the exposed second dielectric layer through the opening in the passivation layer.

It is to be understood that both the foregoing general description and the following detailed description are by examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1:
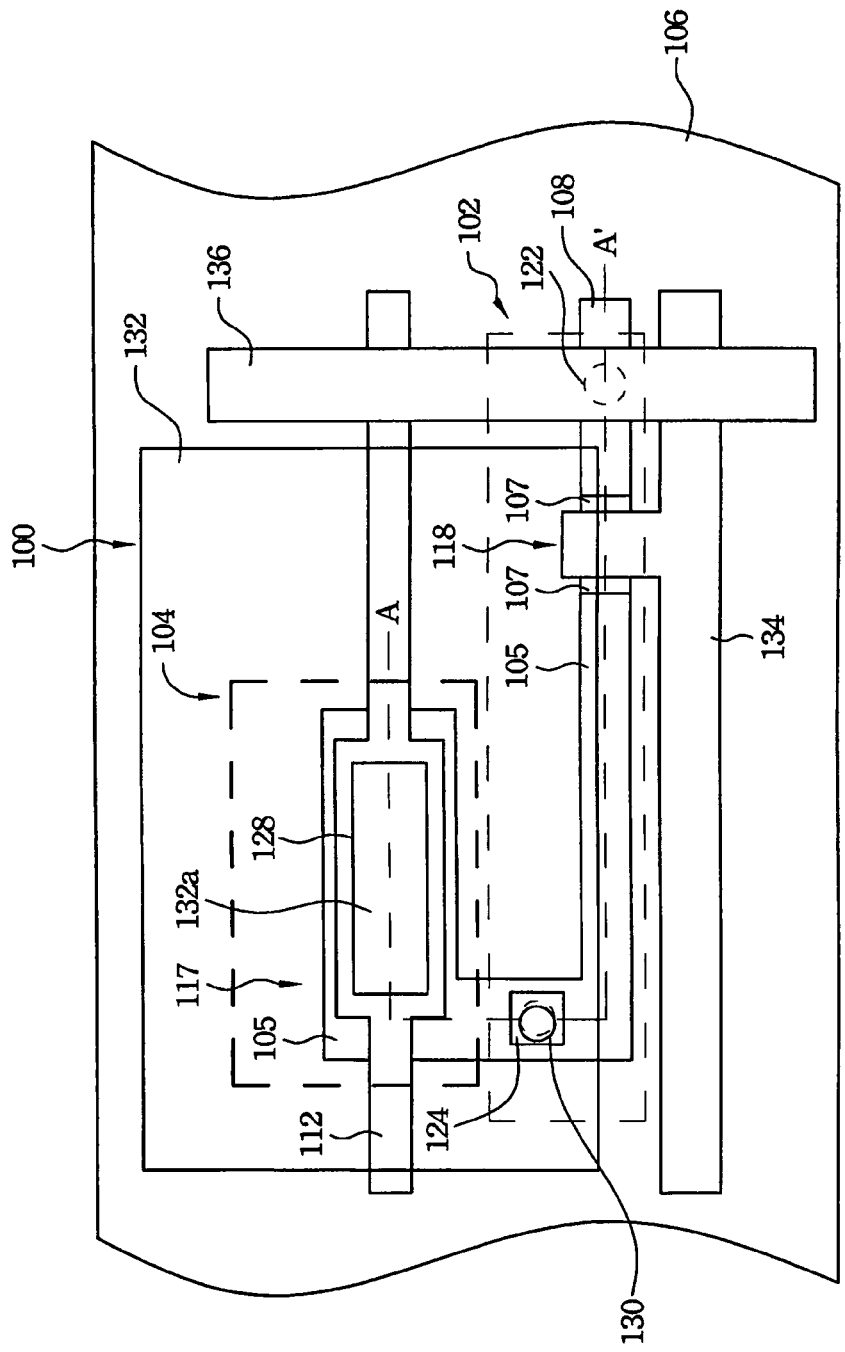
FIG. 1 is a top view of a pixel of a liquid crystal display, according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Referring to FIG. 1, it illustrates a top view of a pixel of a liquid crystal display, according to an embodiment of the present invention. In FIG. 1, a pixel 100 is disposed on the area defined by the scan line 134 and the signal line 136 on the substrate 106, which has a switch element area 106 and a capacitor area 104. In the embodiment of the present invention, a capacitor stack structure 117 is disposed in the capacitor area 104 and a thin film transistor (TFT) is disposed in the switch element area 102 to control the switch of the pixel. The gate stack structure 118 of TFT is connected to the scan line 134, and the source/drain 122 of TFT is electrically connected to signal line 136 and the semiconductor layer 108 in the switch element area 102. The other source/drain 124 is electrically connected to the semiconductor layer 108 in the capacitor area 104 and the pixel electrode 132. In addition, the capacitor stack structure 117 in the capacitor area 104 is used as a storage capacitor. The capacitor stack structure 117 comprises a part of the semiconductor layer 108, a part of the conductive layer 112, an electrode 132a, and dielectric layers between any two layers (not shown), wherein the electrode 132a is a part of the pixel electrode 132.

Figure 2A:
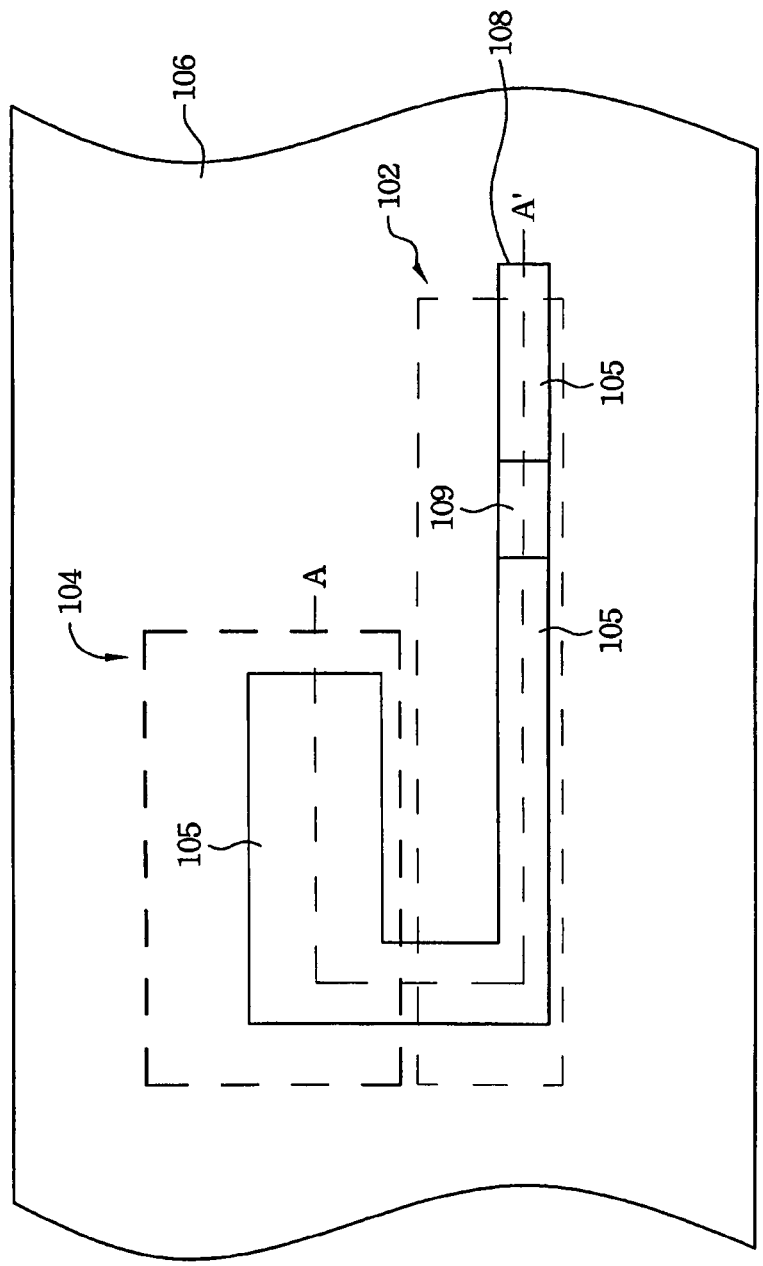
FIGS. 2A-2E are illustrate top views of each layer of pixel shown in FIG. 1 according to one preferred embodiment of this invention.

FIGS. 2A-2E illustrate top views of each layer of pixel shown in FIG. 1. As shown in FIG. 2A, the substrate 106 comprises the semiconductor 108. A first doping region 105 and a channel region 109 is located and pre-defined in the semiconductor 108 in the switch element area 102, wherein the channel region 109 is also called the non-doping area, since it is not doped with any dopants.

Figure 2B:
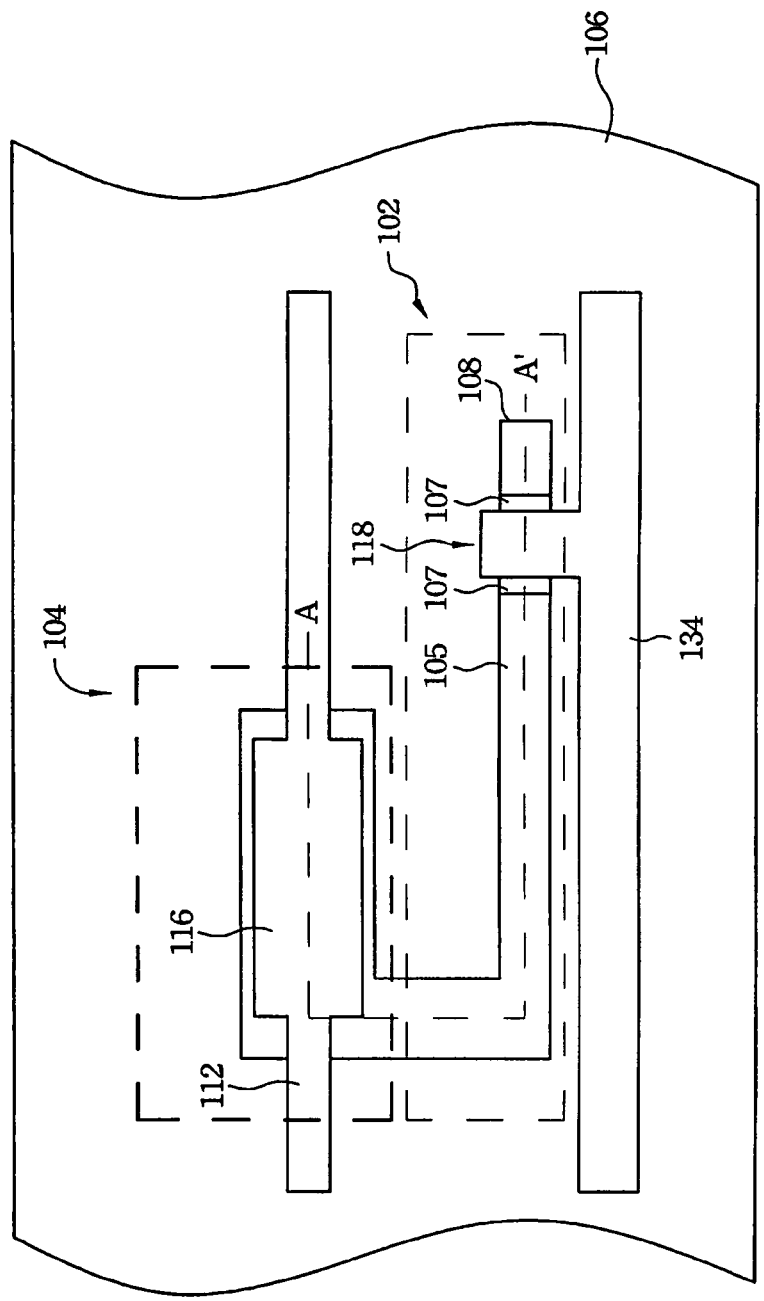

Referring to FIG. 2B, an insulating layer (not shown) is formed on the substrate 108 by the first dielectric layer. The first conductive layer 112, the second dielectric layer (not shown), and a sacrificial layer (not shown) are disposed in sequence on the insulating layer in the capacitor area 104, and the insulating layer is formed on the semiconductor layer 108 in the capacitor area 104. The gate stack structure 118 is disposed on the channel region 109 of the semiconductor layer 108 in the switch element area 102, and the gate stack structure 118 is connected with the scan line 134. In the embodiment of the present invention, after the first conductive layer is formed (i.e. after the gate stack structure 118 is formed), a part of the semiconductor layer where the first doping region 105 and the channel region 109 is located is pre-defined by the first doping process to form the first doping region and the channel region as an exemplification. In addition, on at least one of the two sides of the channel region 109, a second doping process is performed using the gate stack structure 118 as a mask to selectively define a doping region 107 or namely a second doping region. Preferably, the doping region 107 is called the light doping region since the doping concentration of the doping region 107 is substantially less than that of the first doping area 105. The first doping region 105 is called the heavy doping area or source/drain region. Although the first doping region 105, the channel region 109, and the light doping region 107 are formed individually at different time in the embodiment of the present invention, they could be formed at the same time. Furthermore, the first doping region 105, the light doping region 107, and the channel region 109 can also be optionally formed by a photolithographic process and an ionic implementation process before the gate stack structure 118 is formed. For example, a photoresist is formed on the semiconductor layer 108 or the first dielectric layer, and then the photoresist is step-shaped or taper-shaped by exposing the photoresist, and the first doping region 105, the light doping region 107, and the channel region 109 are formed at the same time by the first doping process. In addition to that, the first doping region 105, the light doping region 107, and the channel region 109 can be formed by a photolithographic process or an ionic implementation process before the gate stack structure 118 is formed. For example, a photoresist is formed on the first dielectric layer or the first conductive layer, and then the photolithographic process shapes the first dielectric layer and/or the first conductive layer into a step-shape or taper-shape, and the first doping region 105, the light doping region 107, and the channel region 109 are formed at the same time by the first doping process. Furthermore, as to the light doping region 107, the doping region 105, and the channel region 109 formed at different time, it can be performed as follows: after the first doping region 105, and the channel region 109 are formed on the semiconductor layer, or after the first dielectric layer is formed, or after the first conductive layer is formed, a photoresist is formed on one of the semiconductor layer 108, the first dielectric layer, and the first conductive layer. After that, the pre-determined location of the light doping region 107 is revealed by exposing the photoresist, and finally the light doping region 107 is formed by the second doping process.

Figure 2C:
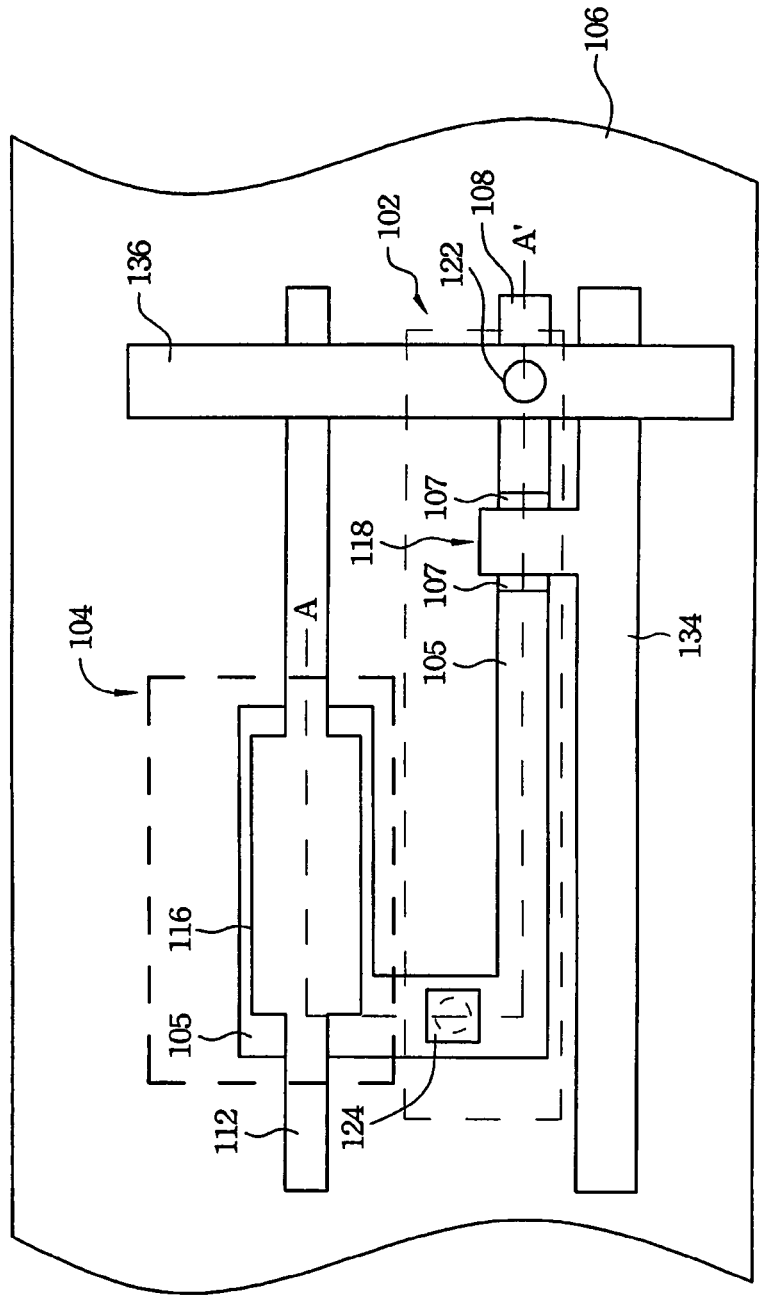

Next, as shown in FIG. 2C, an interlayer dielectric layer (not shown) is formed on the substrate 106 to cover all of the above-mentioned elements. A source/drain 122 is disposed on the interlayer dielectric layer on one side of the gate stack structure 118 that is away from the capacitor area 104, wherein the source/drain is electrically connected to the first doping region 105 of the semiconductor layer 108 through one hole (not shown) and the signal line 136. A source/drain 124 is disposed on the interlayer dielectric layer on another side of the gate stack structure 118 near the capacitor area 104, wherein the source/drain 124 is electrically connected to the first doping region 105 of the semiconductor layer through another hole (not shown).

Figure 2D:
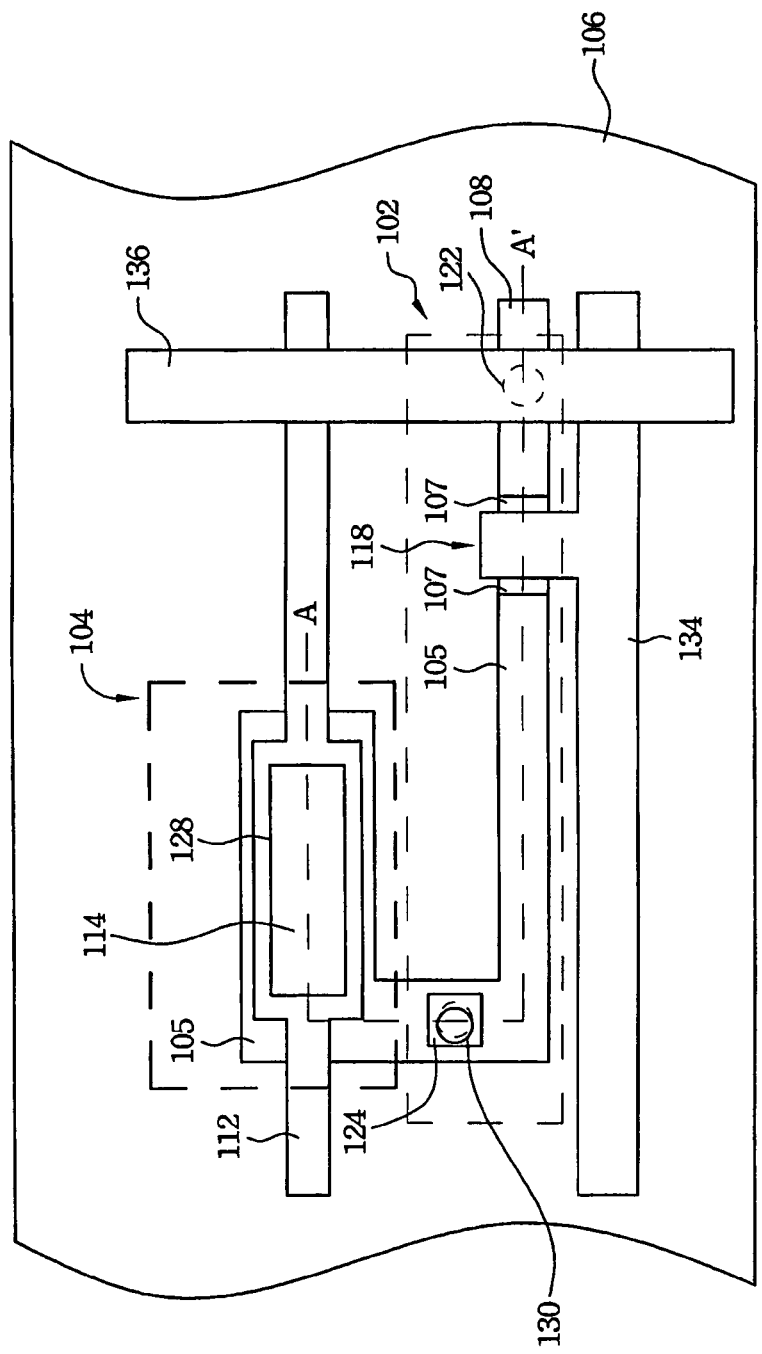

Next, as shown in FIG. 2D, a passivation layer (not shown) is disposed on the substrate to cover all of the above-mentioned elements. An opening 128 is formed in the passivation layer, the interlayer dielectric layer, and the sacrificial layer (not shown) to expose the second dielectric layer 114 underneath. Meanwhile, above the source/drain 124, a contact window 130 is formed in the passivation layer to expose a part of the source/drain 124. In addition, the contact window 130 can be selectively substantially aligned with the another hole (not labeled) or not.

Figure 2E:
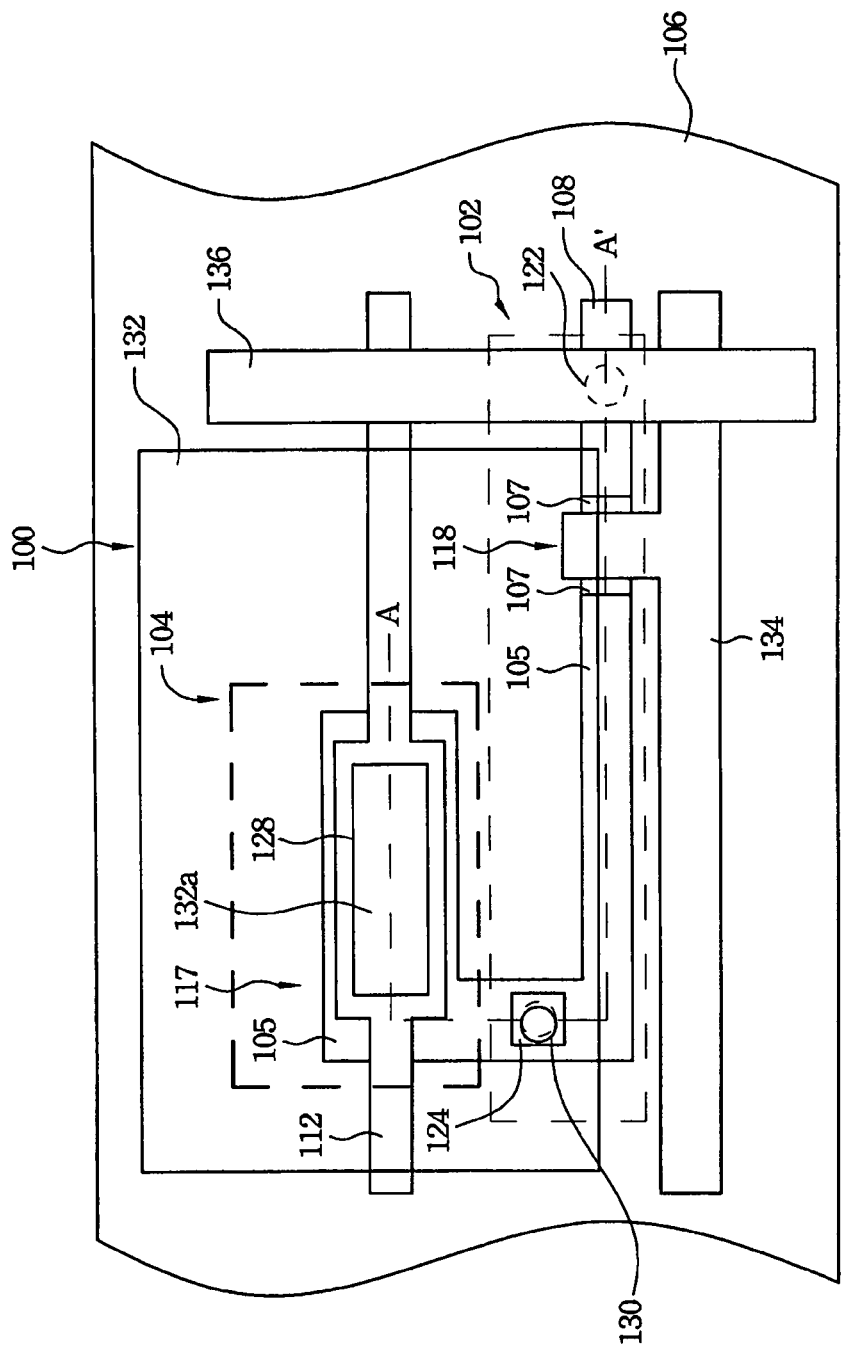

Finally, as shown in FIG. 2E, a pixel electrode 132 (not shown) is disposed on the passivation layer and filled in the contact window 130 and the opening 128 to electrically connect with source/drain 124 and form an electrode 132a of the capacitor stack structure 117. Preferably, the pixel electrode 132 is formed in conformity with the contact window 130 and opening 128.

Figure 3:
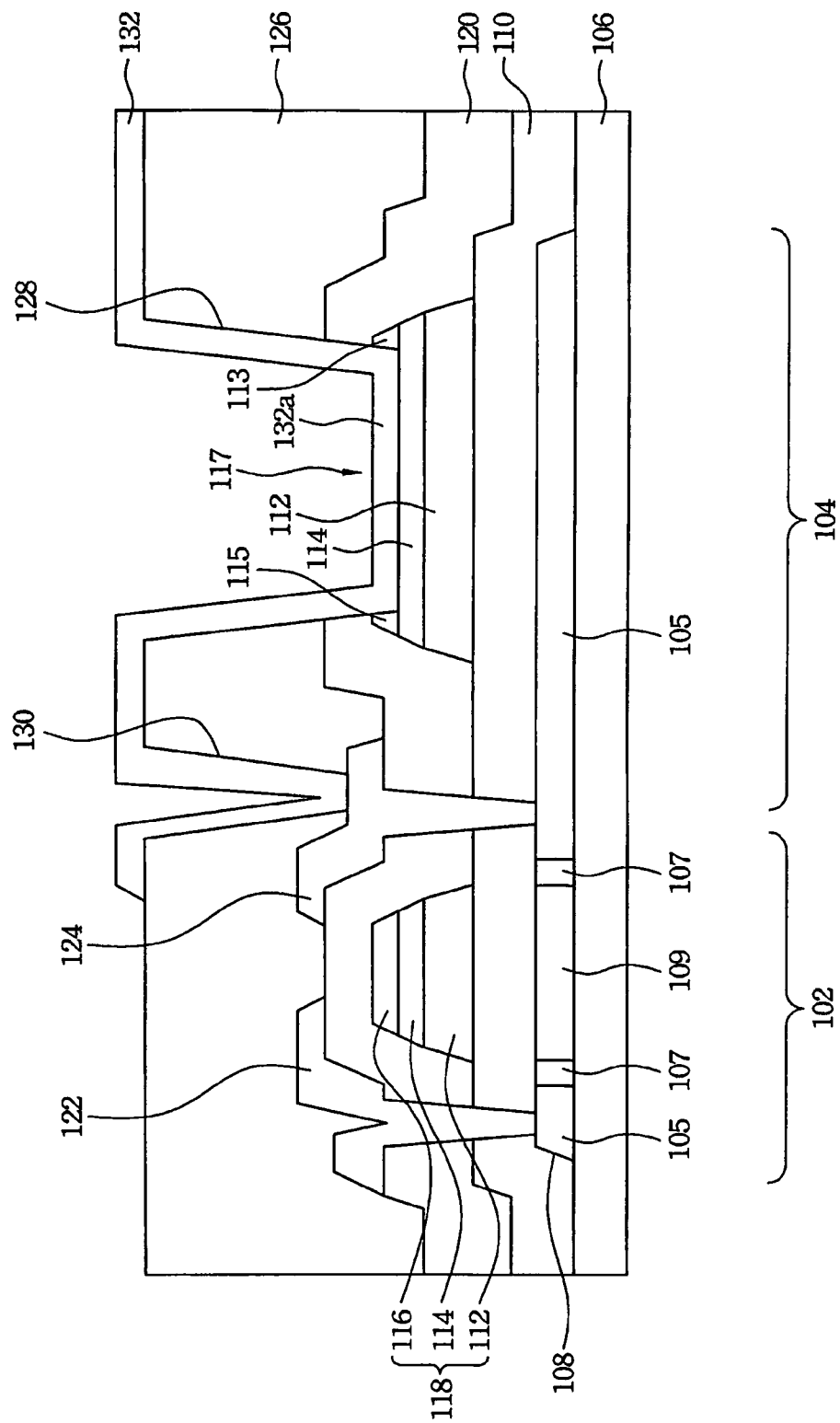
FIG. 3 is a cross section view along with line AA' in the FIG. 1.

The structure of each layer of the storage capacitor and the pixel above will be described in more detail as follows. To simplify the figures and to explain easily, FIG. 3 illustrates a cross section view along with line AA' in the FIG. 1. As shown in FIG. 3, the substrate 106 and the semiconductor layer 108 thereon comprise a switch area 102 and a capacitor area 104. A capacitor 117 in the capacitor area 104 comprises a semiconductor layer 108, a first dielectric layer 110, a first conductive layer 112, a second dielectric layer 114, and the electrode 132a, which is used as a storage capacitor. Two lateral sides of the storage capacitor are covered by the interlayer dielectric layer 120. As shown in the Figure, the first dielectric layer 110 covers the semiconductor layer 108 and the substrate 106. The first conductive layer 112 and the second dielectric layer 114 are disposed in sequence on a part of the first dielectric layer 110. Furthermore, the second dielectric layer 112 and the first conductive layer 114 is formed a stacking structure and the lateral side of the stacking structure or at least one of two edges of the stacking structure has a substantially tapered shaped which is also called a taper structure. The passivation layer 126 covers the formed structures. The passivation layer 126 comprises an opening 128 which exposes parts or all of the second dielectric layer 114. The pixel electrode 132 is disposed on a part of the passivation layer 126 and is in the opening 128. The pixel electrode located at the bottom of the opening 128 is used as an electrode 132a of the storage capacitor. The remaining layer 113 and 115 are part of the sacrificial layer remaining on the second dielectric layer 114 in the process of removing the sacrificial layer. Therefore, the remaining layers 113 and 115 can be selectively located on both ends of the second dielectric layer 114 respectively, or at least one of remaining layers 113 and 115 located on only one end of the second dielectric layer 114, or the reaming layer 113 and 115 can be selectively removed from the second dielectric layer 114 in the capacitor area 104. However, the above-mentioned structures are not limited herein. The remaining layers 113 and 115 may also be located on a part of the second dielectric layer 114, such as substantially on two positions far from both ends of the second dielectric layer, substantially on the center of the second dielectric layer, on other places or the combination thereof. In the embodiment of the present invention, the two remaining layer are used as exemplified and one or no remaining layer may be implemented in another embodiment.

Next, refer to FIG. 3 again, the substrate 106 in the switch element area 102 comprises a semiconductor layer 108, and the first dielectric layer 110 covers the semiconductor layer 108 and the substrate 106. A gate stack structure 118 is located on the first dielectric layer 110 in the switch element area 102. The gate stack structure 118 comprises a first conductive layer 112 and a second dielectric layer 114, and may optionally comprise a sacrificial layer 116. The interlayer dielectric layer 120 covers the substrate. The source drain 122 and 124 is disposed on a part of the interlayer dielectric layer 120 in the switch element area 102 and electrically connects to the semiconductor layer 108 in the switch element area 102. The passivation layer 126 covers the substrate. The pixel electrode 132 is disposed on a part of the passivation layer 126 and is electrically connected to the source/drain. The semiconductor layer 108 comprises a channel region 109 substantially located underneath the gate stack structure and at least one of two sides of the channel region 109 comprises at least a light doping region 107. In the embodiment of the present invention, both sides of the channel region 109 comprise the light doping region 107, but not limited in the structure herein. The source/drain 122/124 contacts the semiconductor layer 108 has a place, where the place are located outside the light doping region 107. In other words, the source/drain 122/124 is connected in the first doping region 105 of the semiconductor layer 108. In addition, at least one of the first dielectric layer, the second dielectric layer, the interlayer dielectric layer and the passivation layer comprises organic material (i.e. photoresist, polymethylmethacrylic, polycarbonate, polyols, polyolefines, polyimide, benzocyclobutene, parylene-N(PA), silicon containing carbon, oxygen or hydrogen, other materials or the combination thereof), inorganic material (i.e. silicon oxide, silicon nitride, silicon oxide nitride, silicon carbide, other material or the combination thereof), or the combination thereof.

Figure 4A:
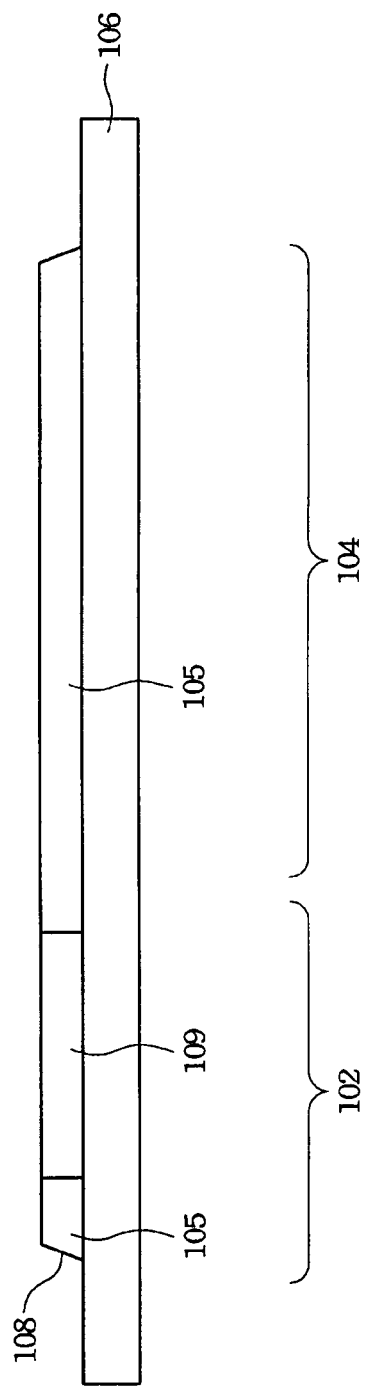
FIGS. 4A-4F are cross section views of the pixel in FIG. 3 at each manufacturing stage.

FIGS. 4A-4F illustrate cross section views of the pixel in FIG. 3 at each manufacturing stage. Referring to FIG. 4A, it illustrates a cross section view along the line AA in FIG. 2A. The pixel is disposed on the substrate 106 which can be defined as a switch element area 102 and a capacitor area 104. The semiconductor layer 108 is formed on the substrate 106. Next, the semiconductor layer 108 is patterned. After being patterned, a part of the semiconductor layer 108 where the channel region is pre-determinedly located, is shielded by a mask and a first doping process is performed on the semiconductor layer to form a first doping region 105 and a non-doping region wherein the non doping region is used as a channel region 109. The method used for forming and patterning the semiconductor layer 108 can be, for example, chemical vapor deposition and photolithography but not limited herein. Other methods can also be used such as coating, stencil printing, inkjet printing, or other methods for patterning the semiconductor 108. In the embodiment of the present invention, the semiconductor 108 can be silicon-containing material such as single crystalline silicon, polycrystalline silicon, amorphous silicon, micro-crystalline silicon, other silicon-containing material or the combination thereof. The above-mentioned first doping process can be N-doping or P-doping so that the semiconductor layer 108 can be turned into an N-type, P-type semiconductor, or the combination thereof.

Figure 4B:
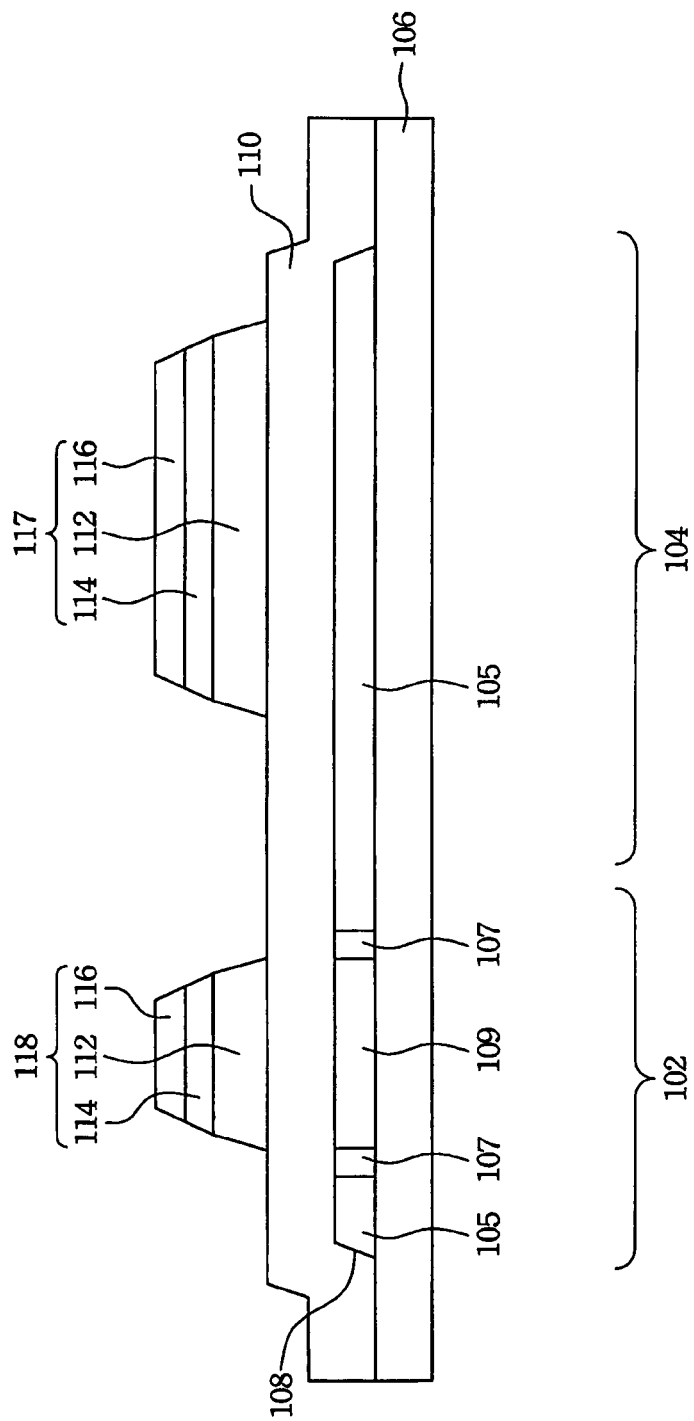

FIG. 4B illustrates a cross section view along with line AA' the in the FIG. 2B. First, after removing the mask, a dielectric layer 110 is formed on the semiconductor layer 108 and the substrate 106. Next, a first conductive layer 112, a second dielectric layer 114, and a sacrificial layer 116 are formed on the first dielectric layer 110. Preferably, the three layers are formed in sequence (i.e. the first conductive layer 112, the second dielectric layer 114, and the sacrificial layer 116). After that, the first conductive layer 112, the second dielectric layer 114, and the sacrificial layer 116 are patterned. Preferably, the above-mentioned three layers (i.e. the first conductive layer 112, the second dielectric layer 114, and the sacrificial layer 116) are patterned at the same time to form a gate stack structure 118 in the switch element area 102 and a part of the capacitor stack structure 117 in the capacitor area 104, respectively. To decrease the short channel effect, the gate stack structure 118 can be used as a mask to perform a second doping process so that a light doping region 107 can be selectively formed in at least one side of the channel region 109 and the semiconductor area 108 could comprise a non-doping region, a light doping region 107, and a first doping region 105. However, the semiconductor layer may alternatively selective comprises a non-doping region and a first doping region. Furthermore, one thing needs to be clarified is that the above-mentioned doping process is performed twice to form a non-doping region, a light doping region 107, and a first doping region 105 in the semiconductor layer, but not limited herein. The first doping region 105, the light doping region 107, and the channel region 109 can also be optionally formed at the same time. For example, a photoresist is formed on the patterned semiconductor layer 108, and then the exposing process shapes the photoresist into a step shape or a tapered shape, and then the first doping region 105, the light doping region 107, and the channel region 109 are formed by a first doping process. In addition to that, a photolithographic process, an etching process, and an ionic implant process can also form the first doping region 105, the light doping region 107, and the channel region 109. For example, the first dielectric layer is etched to result in a step-shape or a tapered-shape, and then the first doping region 105, the light doping region 107, and the channel region 109 are formed by the doping process at the same time. Moreover, in the embodiment of the present invention, the first doping process is performed while the semiconductor layer is patterned. However, it can be optional that at least two of a photolithographic process, an etching process, and an ion implant process are performed, after the first dielectric layer is formed so that the first doping region 105, the light doping region 107 and the channel region 109 can be formed either at the same time or not in the patterned semiconductor layer. It can also be an option that the first doping process is performed to form the first doping region 105 and a channel region 109 after the first dielectric layer is formed. After that, the second doping process is performed using the gate stack structure and/or the mask layer, or the first patterned conductive layer and/or the mask layer to form a light doping region after the gate stack structure and the first patterned conductive layer is formed. It can also be an option that at least two of a photolithography process, an etching process, and an ion implant process are performed to form the first doping region 105, the light doping region 107, and the channel region 109 either at the same time or not in the patterned semiconductor layer after the gate stack structure or the first patterned conductive layer is formed.

In the embodiment of the present invention, at the step of patterning the first conductive layer 112, the second dielectric layer 114, and the sacrificial layer 116, a photolithographic process using a normal mask can be utilized. In addition, the sacrificial layer 116 comprises a silicon-containing layer (e.g. single crystalline silicon, polycrystalline silicon, amorphous silicon, micro crystalline silicon, other silicon-containing material or the combination thereof). The thickness of the second dielectric layer 114 is substantially between 200 Å to 3000 Å, preferably substantial less than 1000 Å, but not limited herein. The thickness of the sacrificial layer is preferably between about 200 Å to about 3000 Å, but not limited herein. A lateral side of at least one of the patterned gate stack structures and the capacitor stack structures substantially has a tapered shape which is substantially less than 90°, preferably substantially less than 70°, but not limited herein. In addition, at the step of patterning the first conductive layer 112, the second dielectric layer 114, and the sacrificial layer 116, the photolithographic process can be optionally performed using a mask with different a transparency (e.g. half-tone mask, diffraction mask, stripe mask, or other similar masks) to form the gate stack structure and the capacitor stack structure. The sacrificial layer 106 on the gate stack structure can be removed together using the masks with different transparency to perform the etching process.

Figure 4C:
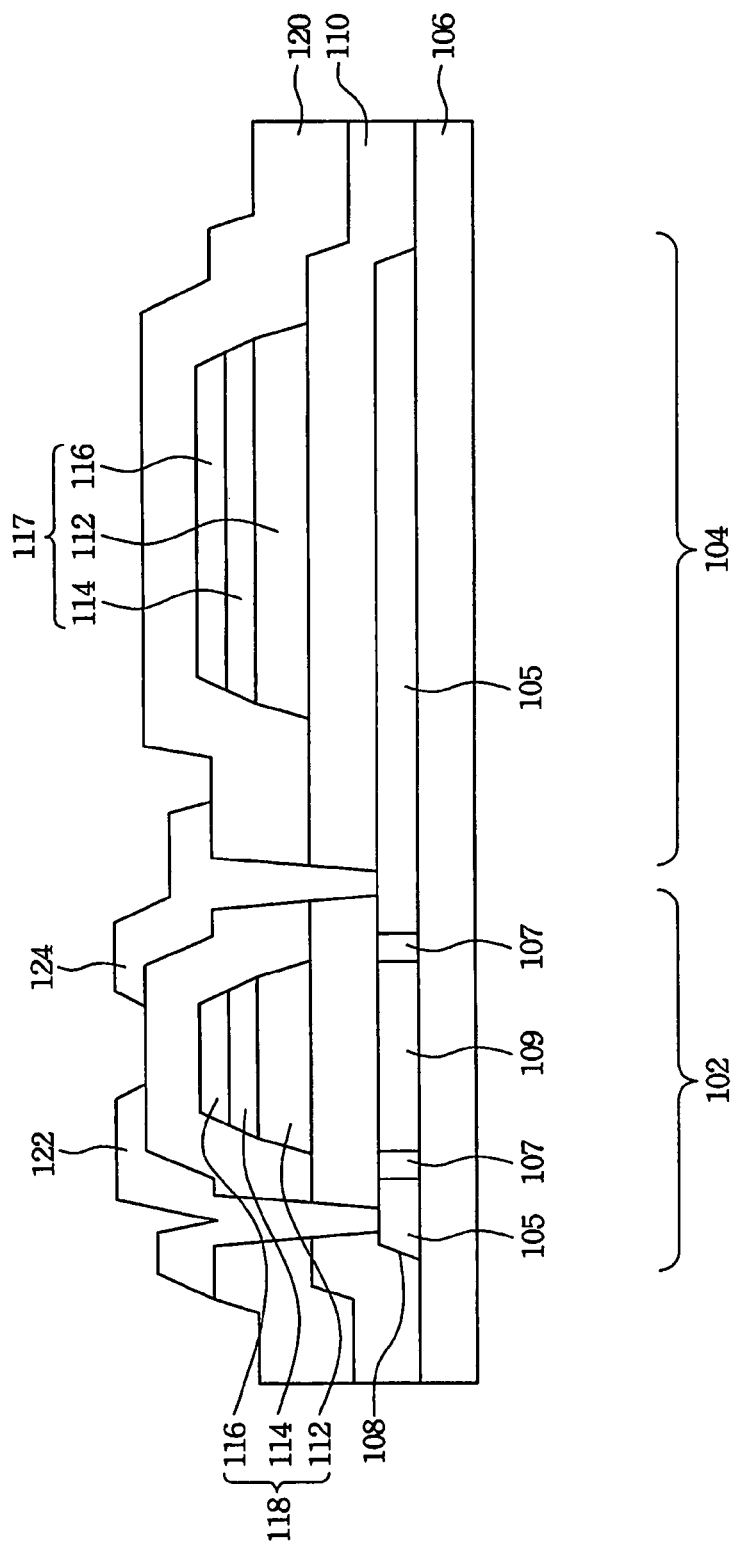

FIG. 4C illustrates the cross section view along with line AA' in FIG. 2C. The interlayer dielectric layer 120 is formed on the gate stack structure 118, a part of the capacitor stack structure 117, and a first dielectric layer 110. After that, a part of the interlayer dielectric layer 120, and the first dielectric layer 110 in the switch element area 102 are patterned to expose a part of the surface of the semiconductor layer 108. The method of forming the interlayer dielectric layer can be, for example, chemical vapor deposition, but not limited herein. Other methods can be optionally used, such as coating, stencil printing, inkjet printing, or other methods to form the interlayer dielectric layer 120. Next, the source/drain 122/124 is formed on a part of the interlayer dielectric layer 120 in the switch element area 102 and is electrically connected with a doping region 105 of the semiconductor layer 108.

Figure 4D:
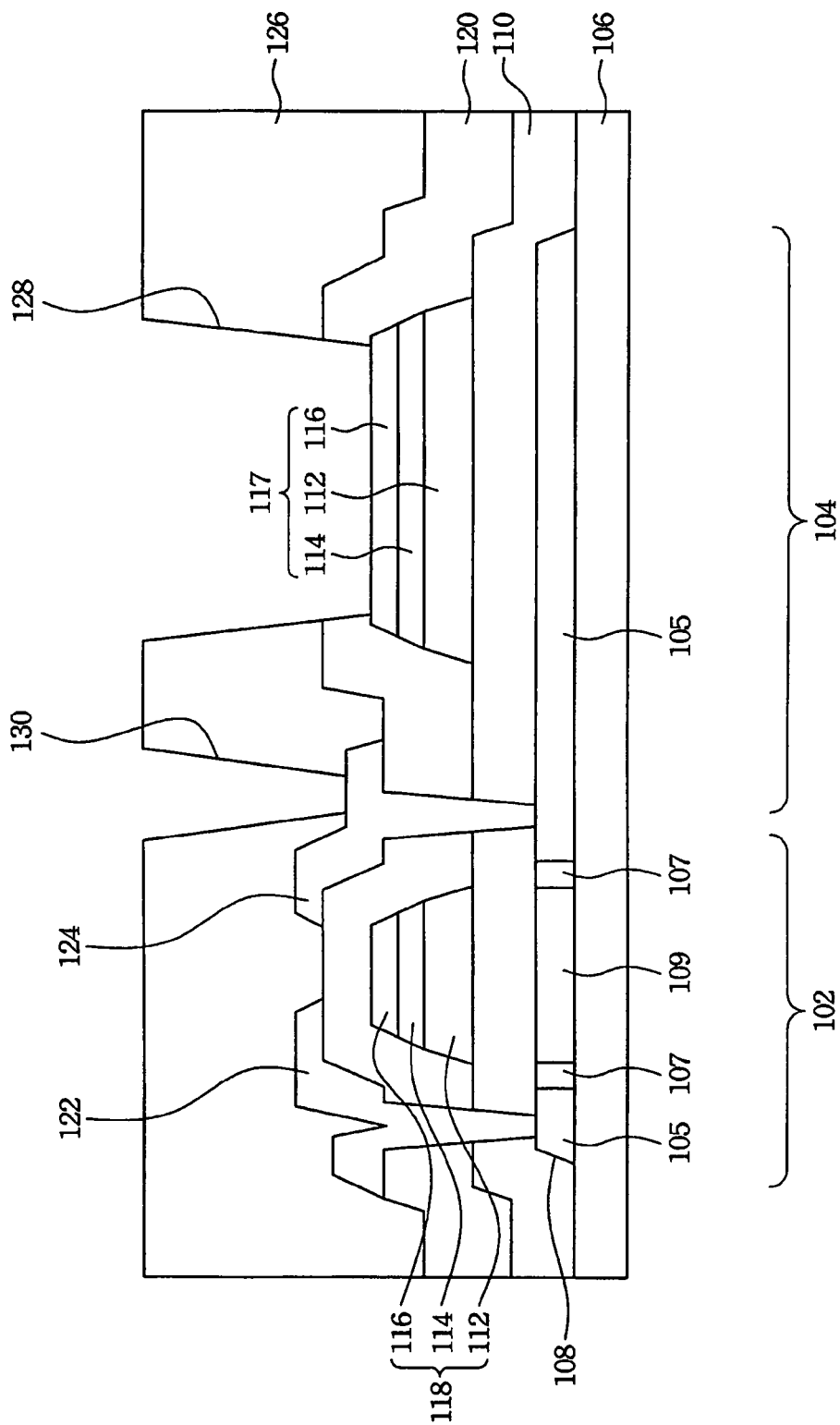

Referring to FIG. 4D. FIG. 4D illustrates a cross section view along with line AA' in FIG. 2D. A passivastion layer 126 is formed on the source/drain 122/124 and the interlayer dielectric layer 120. Next, the sacrificial layer 116 is used as an etching-stop layer to pattern the passivation layer 126 and the interlayer dielectric layer 120 to form at least one contact window 130 in the switch element area 102 and at least one opening 128 in the capacitor area 104, respectively. As a result, a part of or whole sacrificial layer 116 is exposed in the opening 128, and a part of or whole source/drain 124 is exposed in the contact window 130.

In the patterning process, if the etching method is used for patterning, the interlayer dielectric layer 120 and the sacrificial layer 116 both have different etching rates for selectively being etched to prevent them from being over-etching. Hence, after the interlayer dielectric layer 120 in the opening 128 is removed, the exposed surface of the sacrificial layer 116 will slow down the etching rate. Certainly, other methods can optionally be used for patterning.

Figure 4E:
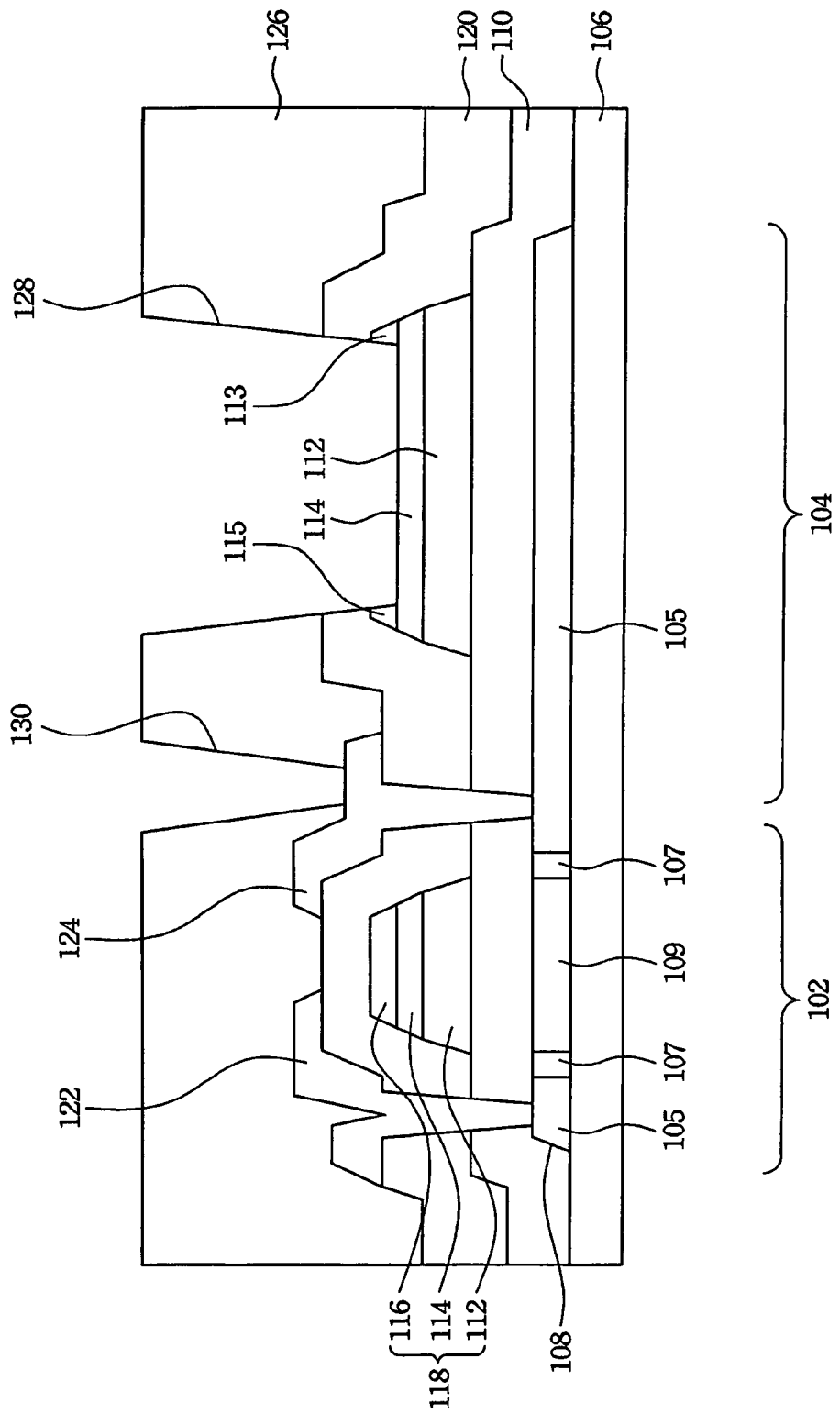

Next, FIG. 4E illustrates a cross section view along with line AA' in FIG. 2D. In FIG. 4E, the exposed sacrificial layer 116 in the opening 128 of the capacitor area 104 is patterned. While patterning the sacrificial layer 116 by an etching process, the remaining layers 113 and 115 can be optionally retained on both ends of the second dielectric layer 114 in the capacitor area 104. It can also be an option that any one of the remaining layers 113 and 115 is optionally retained on either end of the second dielectric layer 114, or the remaining layers 113 and 115 are completely removed or disposed on a part of the second dielectric layer, for example, substantially on two positions far from both ends of the second dielectric layer, substantially at the center of the second dielectric layer, on other places or the combination thereof. This depends on the area of the sacrificial layer 116 exposed by the opening 128, for example a part of or whole of the sacrificial layer 116 exposed. However, whether the sacrificial layer 116 is retained on the second dielectric layer 114 or not, does not affect the electrical property of the capacitor.

Similarly, to prevent from over-etching, the sacrificial layer 116 and the second dielectric layer 114 also have different etching rates while patterning. Therefore, after removing the sacrificial layer 116 in the capacitor area 104, the etching rate is decreased by the exposed surface of a part of the second dielectric layer 114 again. Preferably, the etching selectivity ratio of the sacrificial layer 116 to the second dielectric layer 114 is substantially greater than or equal to 2, which means that the etching rate of the sacrificial layer 116 is substantially greater than that of the second dielectric layer 114. In the embodiment of the present invention, the sacrificial layer 116 made of an amorphous silicon layer and the second dielectric layer 114 made of a silicon oxide layer are exemplified and are not limited herein. Other materials can also be optionally used so that the etching rate of the sacrificial layer 116 is substantially greater than that of the second dielectric layer 114. Accordingly, the etching rate of the exemplified sacrificial layer 116 made of amorphous silicon is from about 200 A/min to about 10,000 A/min, and the etching rate of the exemplified second dielectric layer 114 made of silicon oxide is substantially less than 100 A/min. Hence, the etching selectivity ratio of the amorphous silicon layer to the silicon oxide layer is substantially from 2 to 100, which indicates that the etching selectivity ratio of the amorphous silicon layer is substantially greater than that of the silicon oxide layer, and is substantially greater than or equal to 2. The materials used are not limited herein.

Figure 4F:
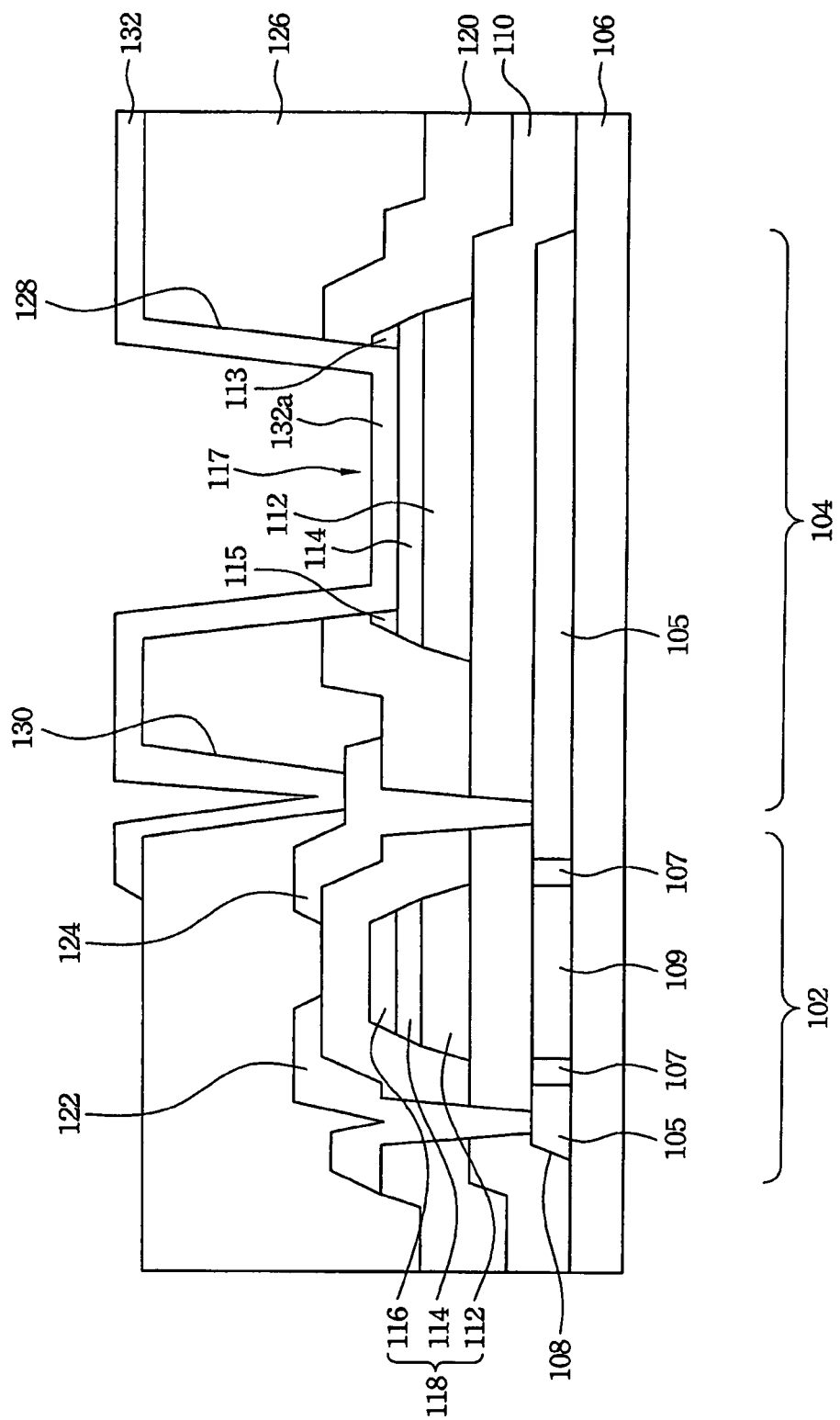

Referring to FIG. 4F, illustrates a cross section view along with line AA' in FIG. 2E. As shown in FIG. 4F, a second conductive layer is formed on a part of the passivation layer 126 as a pixel electrode 132. The pixel electrode 132 formed on the source/drain 124 in the switch element area 102 can be further electrically connected with the first doping region 105 in the patterned semiconductor layer 108. The pixel electrode 132 formed on a part of the second dielectric layer 114 exposed in the opening 128 in the passivation layer 126 in the capacitor area 104 is used as an electrode 132a of the electrode stack structure 117.

In the embodiment above, at least one of the first conductive layers and the second conductive layer comprises a transparent material (e.g. tin indium oxide, aluminum zinc oxide, indium zinc oxide, cadmium tin oxide, other materials or the combination thereof), non-transparent material (e.g. aurum, silver, copper, tin, lead, cadmium, molybdenum, neodymium, titanium, tantalum, hafnium, tungsten, alloys of metals above, nitrides of metals above, oxides of metals above, nitride oxides of metals above, other materials, or the combination thereof), or a combination thereof. At least one of the first dielectric layers, the second dielectric layer, the interlayer dielectric layer, and the passivation layer comprises organic materials (e.g. photoresist, polymethylmethacrylic, polycarbonate, polyols, polyolefines, other material or a combination thereof), inorganic materials (i.e. silicon oxide, silicon nitride, silicon oxide nitride, silicon carbide, other material or a combination thereof or a combination thereof. Furthermore, the transparent materials (e.g. tin indium oxide, aluminum zinc oxide, indium zinc oxide, cadmium tin oxide, other materials or a combination thereof) used for the pixel electrode are exemplified, and non-transparent materials (e.g. aurum, silver, copper, tin, lead, cadmium, molybdenum, neodymium, titanium, tantalum, hafnium, tungsten, alloys of metals above, nitrides of metals above, oxides of metals above, nitride oxides of metals above, other materials, or a combination thereof), or transflective materials (e.g. one part of the material is transparent and the other part of the material is non-transparent, or the material have transflective property) may also be used.

Figure 5:
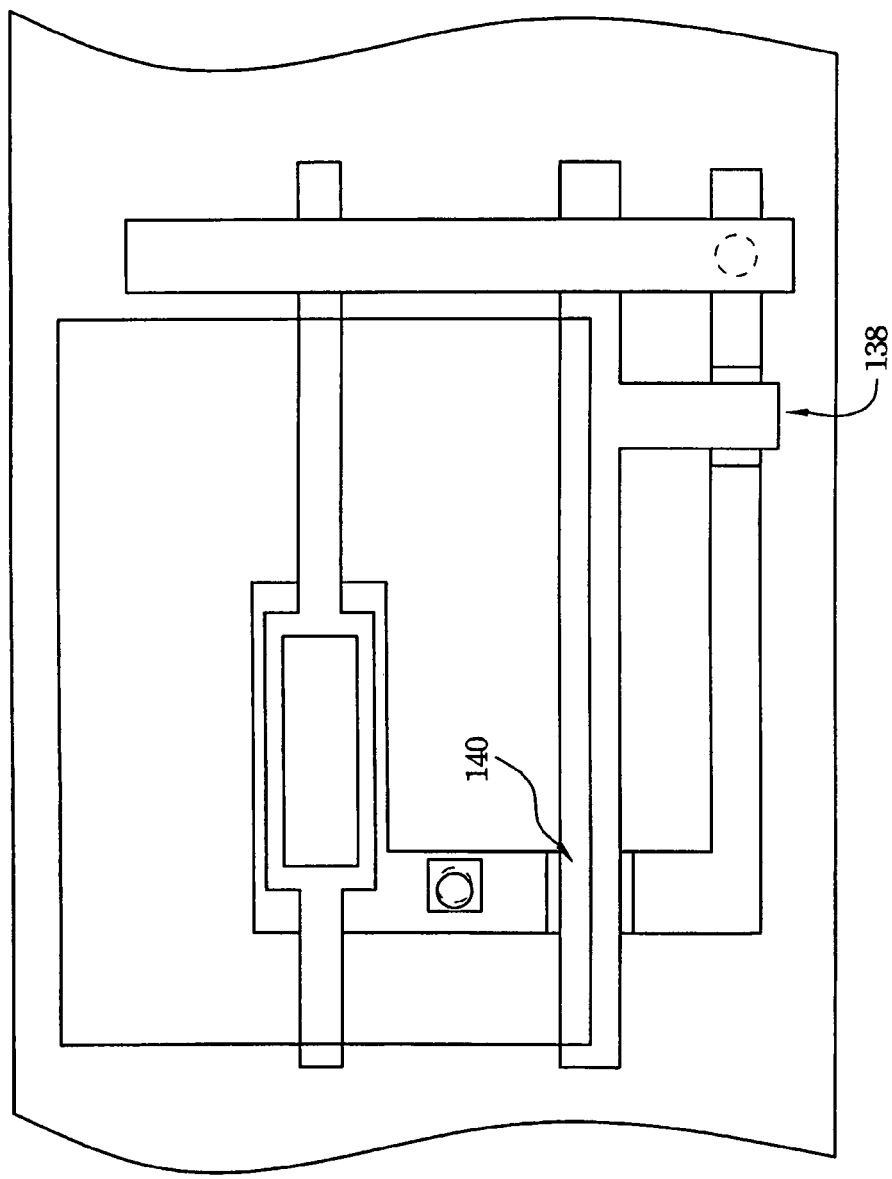
FIG. 5 is a top view of a two-gate pixel according to an embodiment of the present invention.

In addition, the pixel mentioned in the embodiment of the present invention may have two gates or more than two gates. As shown in FIG. 5, the gates 138 and 140 are in a two-gate structure. Since the variations of the pixel structure are well-known by the person having ordinary skill in the art, the variations will not be described herein. Moreover, the switch elements in the switch element area mentioned in the above embodiment are adapted for a top-gate structure which is an exemplification in the present invention and should not be limited herein. Other types of the switching element structures such as other top-gate structures, bottom-gate structures, or other switching element structures can also be used.

In addition, the above-mentioned embodiment of the present invention includes the gate stack structure and the capacitor stack structure of the pixel 100, the sacrificial layer 116 remains on the second dielectric layer of the gate stack structure, but not limited herein. It is also optional that only a part of the sacrificial layer 116 is retained on the second dielectric layer of the capacitor stack structure, or no sacrificial layer 116 is retained on the second dielectric layer of the gate stack structure, or no sacrificial layer 116 is retained on the second dielectric layer of the capacitor stack structure, or the combination thereof. Moreover, the semiconductor layer on the capacitor area and the switch element area is formed integrally that is an exemplification and not limited herein. The semiconductor layer on the capacitor area and the switch element area can also be interrupted and is connected by a connecting layer (not shown), or the semiconductor layer on the capacitor area and the switch element area can be formed integrally and connected by a connecting layer increase the ability to transfer electrons. The connecting layer comprises transparent materials (e.g. tin indium oxide, aluminum zinc oxide, indium zinc oxide, cadmium tin oxide, other materials or a combination thereof), non-transparent material (e.g. aurum, silver, copper, tin, lead, cadmium, molybdenum, neodymium, titanium, tantalum, hafnium, tungsten, alloys of metals above, nitrides of metals above, oxides of metals above, nitride oxides of metals above, other materials, or a combination thereof), or a combination thereof. In other words, the connecting layer can be formed by at least one of the first conductive layer, the semiconductor layer, the second conductive layer, and the source/drain.

Figure 6:
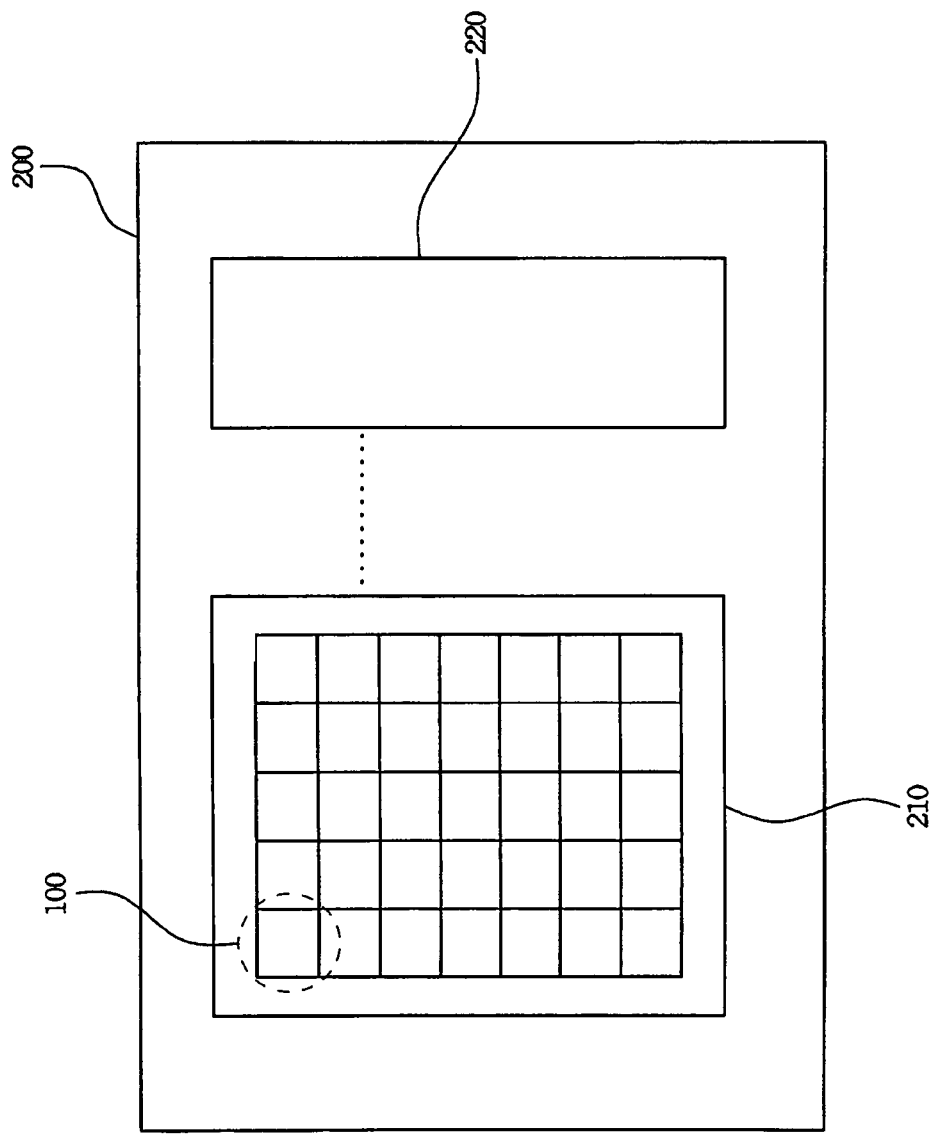
FIG. 6 is a schematic diagram of an electro-optical apparatus according to an embodiment of the present invention.

FIG. 6 illustrates an electro-optical apparatus of the present invention. Referring to FIG. 6, the above-mentioned in the embodiment of the display panel is also applied in an electro-optical apparatus 200. The display panel comprises an array substrate (not shown) and a common electrode substrate (not shown) corresponding to the array substrate. The array substrate comprises a plurality of pixels 100 as described in the above-mentioned embodiment of the present invention. The electro-optical apparatus 200 further comprises a electrical element 220 connecting to the display panel 210, such as a control element, a operative element, a processing element, an input element, a memory element, a driving element, an illuminant element (e.g. inorganic light emitting diode, organic light emitting diode, cold cathode fluorescent lamp, flat lamps, hot cathode fluorescent lamp, external electrode fluorescent lamp, other types of lamps or a combination thereof), a sensor element (e.g. touch element, photo-sensing element, temperature-sensing element, imaging-sensing element, other types, or a combination thereof), a charging element, a heating element, a protective element, other types of the elements or a combination thereof. The electro-optical apparatus can be portable products (e.g. mobile phone, video camera, camera, laptop, video games, watch, music player, e-mail device, global positioning system, electronic photo or the similar products), audio products (e.g. audio display or the similar products), monitor, television, outdoor or indoor panel, or a panel in a projector, and etc. In addition, the display panel 210 comprises liquid crystal display panel (e.g. transmissive panel, transflective panel, reflective panel, double-sided panel, vertical alignment panel (VA), in-plane switching panel (IPS), multi-domain vertical alignment panel (MVA), twisted nemattic panel (TN), super twisted nemattic panel (STN), patterned vertical alignment panel (PVA), super patterned vertical alignment panel (S-PVA), advanced super view panel (ASV), fringe field switch panel (FFS), continuous pinwheel alignment panel (CPA), axial symmetric micelle panel (ASM), optical compensated birefringence panel (OCB), super in-plane switching panel (S-IPS), advance super in-plane switching panel (AS-IPS), ultra fringe field switching panel (UFFS), polymer stable alignment panel (PSA), duel-view, triple-view panel, and color filter on array panel (COA), or array on color filter panel (AOC), other types of panel, or a combination thereof), organic light emitting display panel made of a material that at least has one of the pixel electrode and drain in the panel connects to, such as liquid crystal layer, organic light emitting layer (e.g. small molecule, polymer or a combination thereof) or a combination thereof.

According to the embodiment of the present invention, compared with the conventional capacitor, the thickness of the storage capacitor manufactured by the process above can be reduced to less than about 3000 Å so that the capacity can be increased significantly. Furthermore, the process above can control the desirable thickness of the capacitor as needed and also keeps a better aperture ratio.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A storage capacitor disposed on a substrate, and the storage capacitor comprising:
   at least one semiconductor layer disposed on the substrate;
   at least one first dielectric layer covering the semiconductor layer and the substrate;
   at least one conductive layer disposed on a part of the first dielectric layer;
   at least one second dielectric layer formed only on the first conductive layer, wherein the second dielectric layer and the first conductive layer is formed a stacking structure and a lateral side of the stacking structure has a substantially taper shaped; and
   at least one second conductive layer disposed on a part of the second dielectric layer.

2. The storage capacitor of claim 1, further comprising an etching-stop layer has at least one first part disposed on a part of the second dielectric layer.

3. The storage capacitor of claim 1, further comprising an etching-stop layer has at least one first part and a second part, wherein the first part is disposed on one of two ends of the second dielectric layer and the second part is disposed on the other end which is away from the first end of the second dielectric layer.

4. The storage capacitor of claim 1, wherein the thickness of the second dielectric layer is substantially less than 1000 Å.

5. The storage capacitor of claim 1, wherein the thickness of the second dielectric layer is substantially between 200 Å to 3000 Å.

6. The storage capacitor of claim 1, wherein the second conductive layer electrically connects to the semiconductor layer.

7. a pixel having at least one switch element area and at least one capacitor area disposed on a substrate, and the pixel comprising: at least one semiconductor layer formed on the substrate of the switch element area and the capacitor area; at least one first dielectric layer covering the semiconductor layer and the substrate; at least one first conductive layer formed on a part of the first dielectric layer of the switch element area and the capacitor area; at least one second dielectric layer formed on the first conductive layer of the switch element area and the capacitor area; at least one etching-stop layer, a part of the etching-stop layer formed on second dielectric layer of the switch element area; at least one interlayer dielectric layer covering on the substrate; at least one source/drain, formed on a part of the interlayer dielectric layer of the switch element area, and electrically connected to the semiconductor layer of the switch element area; at least one passivation layer covering the substrate; and at least one second conductive layer, disposed on a part of the passivation layer, electrically connected to one of the source/drain, and disposed on a part of the second dielectric layer through at least one opening within the passivation layer and the interlayer dielectric layer, wherein the second dielectric layer and the first conductive layer are formed a stacking structure and a lateral side of the stacking structure has a substantially tapered shape.

8. the pixel of claim 7, wherein another part of the etching-stop layer comprises at least one first part disposed on a part of the second dielectric layer of the capacitor area.

9. The pixel of claim 7, wherein another part of the etching-stop layer comprises at least one first part and at least one second part wherein the first part is disposed on one of two ends of the second dielectric layer and the second part is disposed on the other end which is away from the first end of the second dielectric layer.

10. the pixel of claim 7, wherein the second dielectric layer and the first conductive layer in the switch element area are formed the stacking structure and the lateral side of the stacking structure has the substantially tapered shaped.

11. The pixel of claim 7, wherein the thickness of the second dielectric layer is substantially less than 1000 Å.

12. The pixel of claim 7, wherein the thickness of the second dielectric layer is substantially between 200 Å to 3000 Å.

13. The pixel of claim 7, further comprising a connecting layer electrically connected to the semiconductor layer on the switch element area and the capacitor area.

14. A display panel comprising a signal line and a pixel of claim 7.

15. An electro-optical apparatus comprising an electrical element and a display panel of claim 14.

* * * * *